United States Patent
Watarai

(10) Patent No.: US 7,245,155 B2
(45) Date of Patent: Jul. 17, 2007

(54) DATA OUTPUT CIRCUIT WITH IMPROVED OVERVOLTAGE/SURGE PROTECTION

(75) Inventor: Seiichi Watarai, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 189 days.

(21) Appl. No.: 11/090,795

(22) Filed: Mar. 25, 2005

(65) Prior Publication Data

US 2005/0218935 A1    Oct. 6, 2005

(30) Foreign Application Priority Data

Mar. 30, 2004    (JP)    ............... 2004-097555

(51) Int. Cl.
*H03K 19/0175*    (2006.01)
(52) U.S. Cl. .................................. 326/83; 326/87
(58) Field of Classification Search ............ 326/83, 326/86–87, 68, 63; 327/108
See application file for complete search history.

(56) References Cited

U.S. PATENT DOCUMENTS

| 5,319,259 | A | 6/1994 | Merrill |
| 5,589,785 | A | 12/1996 | Garavan |
| 6,377,121 | B1 | 4/2002 | Giduturi |
| 6,472,908 | B1 * | 10/2002 | Smetana ................. 327/52 |
| 6,522,174 | B2 * | 2/2003 | Martin et al. ........... 326/115 |
| 6,670,830 | B2 * | 12/2003 | Usami et al. ............. 326/86 |
| 2002/0057017 | A1 | 5/2002 | Chan |
| 2002/0149395 | A1 | 10/2002 | Martin et al. |

FOREIGN PATENT DOCUMENTS

JP    08-6676    1/1996

OTHER PUBLICATIONS

European Search Report dated Sep. 1, 2005.

* cited by examiner

*Primary Examiner*—James H Cho
(74) *Attorney, Agent, or Firm*—McGinn IP Law Group, PLLC

(57) ABSTRACT

A data output circuit is composed of first and second differential MOS transistors, first and second cascade MOS transistors, first and second outputs, and first and second resistor elements. The first and second differential MOS transistors receive first and second input voltages on the gates, respectively, sources of the differential MOS transistors being commonly connected. The first cascade MOS transistor is connected between the first differential MOS transistor and the first output, and the second cascade MOS transistor is connected between the second differential MOS transistor and the second output, gates of the first and second cascade MOS transistors being commonly connected. The first transistor element is connected between a ground line and the commonly connected gates, and the second transistor element is connected between a power supply line and the commonly connected gates.

9 Claims, 7 Drawing Sheets

DATA OUTPUT CIRCUIT WITH IMPROVED OVERVOLTAGE/SURGE PROTECTION

BACKGROUND OF THE INVENTION

1. Field of the Invention

The present invention relates to data output circuits integrated within LSIs, such as data output buffer circuits. More specifically, the present invention relates to data output circuits suitable for outputting data on transmission lines through connection slots.

2. Description of the Related Art

The progress in semiconductor technologies has enhanced the use of high-performance computers in various applications. Computers are necessarily designed to be suitable for users' purposes. One approach for improving suitability of computers for users' purposes is to incorporate a set of CPU boards, each used for data processing, on a backplane board in a computer system, as disclosed in Japanese Laid-Open Patent Application No. H08-6676A.

In order to achieve high-speed operation, high speed data transmission is required in the computer system. This necessitates high transmitting speed through data transmission lines on the backplane board, and high operation speed of data output circuits disposed on CPU boards.

Such circumstances require data output circuits to incorporate high-speed, low-power consumption MOS (Metal Oxide Semiconductor) transistors. Such MOS transistors are often required be operated on the low power voltage. Although exhibiting high operation speed, low-voltage transistors suffer from inferior endurance against the overvoltage and surge. Therefore, overvoltage and surge protection is an important issue for a CPU board incorporating data output circuits composed of low-voltage transistors.

FIG. 1 is a circuit diagram showing a typical structure of a conventional data output circuit. Referring to FIG. 1, the data output circuit includes a pair of differential transistors: NMOS transistors 101 and 102. Sources of the NMOS transistors 101 and 102 are connected to a drain of an NMOS transistor 103 through a node 111. The NMOS transistor 103 functions as a constant-current source operating on a bias Vs1 applied to the gate. The source of the NMOS transistor 103 is connected to the ground line gnd.

A drain of the NMOS transistor 101 is connected to an output terminal OUTB and a resistor 105 through a node 113, while a drain of the NMOS transistor 102 is connected to an output terminal OUT and a resistor 106 through a node 114. The resistors 105 and 106 are connected to a drain of a PMOS transistor 104 through a node 112, and the source of the PMOS transistor 104 is connected to a power supply line Vdd. A bias Vc1 is applied to the gate of the PMOS transistor 104, and the PMOS transistor 104 functions as a variable resistor. Here, the power supply line Vdd is provided with a power supply voltage of 3.6V.

Irrespective of the fact that 3.6V is supplied as the power supply voltage, low-voltage transistors typically have a rated operation voltage of 1.3V, and an absolute maximum rating of 1.6V. In the conventional data output circuit, low-voltage transistors are used as the NMOS transistors 101 and 102 and the NMOS transistor 103 for achieving high-speed operation.

In a normal operation of the data output circuit shown in FIG. 1, the voltage between the drain and the gate of the NMOS transistor 101 is equal to or less than the rated operation voltage, that is, 1.3V, when the "Low" level (0V) is developed on the input IN, and the "High" level (1.3V) is developed on the input INB. In some cases, however, an overvoltage may be applied to the output terminal OUT (or the output terminal OUTB) when the CPU board is pulled out from the backplane board without cutting off the power supply of the backplane board. This undesirably causes the voltage between the drain and gate of the NMOS transistor 101 to exceed the absolute maximum rating of 1.6V of the NMOS transistor 101. For example, the voltage between the drain and gate of the NMOS transistor 101 is increased up to 1.8V when a voltage of 1.8V is externally supplied to the output terminal OUTB with the input IN pulled down to the "Low" level (0V)". This undesirably causes an overvoltage to be applied to the NMOS transistor 101, and may result in undesirable failure of the NMOS transistor 101 through the gate-oxide breakdown. Additionally, due to the limitation of the rated operation voltage of the low-voltage transistors, the data output circuit shown in FIG. 1 can not output signal levels over the rated operation voltage of the NMOS transistors 101 and 102 even during the normal operation; this undesirably restricts the use of the data output circuit.

The use of high-voltage MOS transistors, such as multi-oxide transistors, for the NMOS transistors 101 and 102 within the data output circuit shown may achieve effective overvoltage and surge protection; however, this undesirably hinders high speed operation of the data output circuit due to the reduced gain of the high-voltage transistors. Additionally, the use of high-voltage transistors for the NMOS transistors 101 and 102 undesirably prohibits the data output circuit from outputting signals of low DC levels. Further, the use of high-voltage transistors undesirably necessitates a high power supply voltage to allow the data output circuit to operate at high speed.

In order to protect the NMOS transistors 101 and 102, as shown in FIG. 2, high-voltage transistors 201, and 202 may be cascade-connected to the NMOS transistors 101 and 102, respectively. The gates of the high-voltage transistors 201, and 202 is provided with a fixed bias Vc2. The data output circuit of FIG. 2 achieves overvoltage and surge protection using the cascade-connected high-voltage transistors 201, and 202.

The data output circuit of FIG. 2, however, undesirably requires an increased size for the high-voltage transistors 201, and 202; in order to avoid the gain being decreased, the high-voltage transistors 201, and 202 are undesirably required to have an increased gate width. This prohibits the high-speed operation of the data output circuit due to the increased parasitic capacitance of the high-voltage transistors 201, and 202.

SUMMARY OF THE INVENTION

In an aspect of the present invention, a data output circuit is composed of first and second differential MOS transistors, first and second cascade MOS transistors, first and second outputs, and first and second transistor elements. The first and second differential MOS transistors receive first and second input voltages on the gates, respectively, sources of the differential MOS transistors being commonly connected. The first cascade MOS transistor is connected between the first MOS transistor and the first output, and the second cascade MOS transistor is connected between the second MOS transistor and the second output, gates of the first and second cascade MOS transistors being commonly connected. The first transistor element is connected between a ground line and the commonly connected gates, and the second transistor element is connected between a power supply line and the commonly connected gates.

In the data output circuit thus constructed, the first and second cascade MOS transistors provides overvoltage and surge protections for the differential MOS transistors.

Preferably, the data output circuit additionally includes a first P-channel MOS transistor connected between a drain and a gate of the first cascade MOS transistor, having a gate connected to the power supply line; and a second P-channel MOS transistor connected between a drain and a gate of the second cascade MOS transistor, having a gate connected to the power supply line.

Since the first and second P-channel MOS transistors provide overvoltage and surge protection for the first and second cascade MOS transistors, this architecture allows the first and second cascade MOS transistors to be composed of low-voltage transistors. Therefore, this architecture effectively achieves high-speed operation of the data output circuit with efficient overvoltage and surge protection.

BRIEF DESCRIPTION OF THE DRAWINGS

The above and other advantages and features of the present invention will be more apparent from the following description taken in conjunction with the accompanied drawings, in which.

DESCRIPTION OF THE PREFERRED EMBODIMENTS

The invention will be now described herein with reference to illustrative embodiments. Those skilled in the art would recognize that many alternative embodiments can be accomplished using the teachings of the present invention and that the invention is not limited to the embodiments illustrated for explanatory purposed.

In this embodiment, the term "low-voltage transistor" means a MOS transistor adapted to operate on a low voltage as compared with the power supply voltage, exhibiting poor overvoltage and surge protection. In this embodiment, low voltage transistors are assumed to have a rated operation voltage of 1.3V, and an absolute maximum rating of 1.6V. Additionally the term "high-voltage transistor" means a transistor exhibiting improved overvoltage and surge protection as compared with the low voltage transistors.

Figure 1:
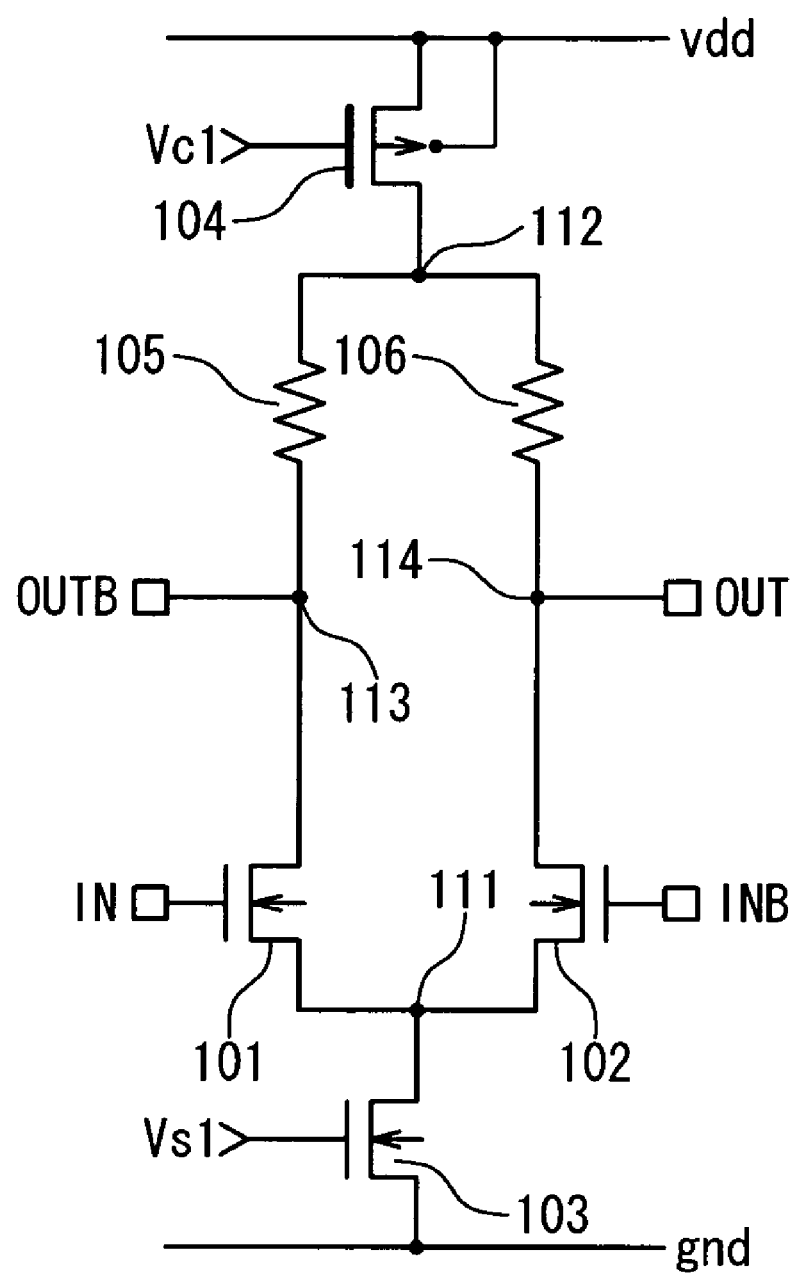
FIG. 1 is a circuit diagram showing a structure of a conventional data output circuit.
Figure 2:
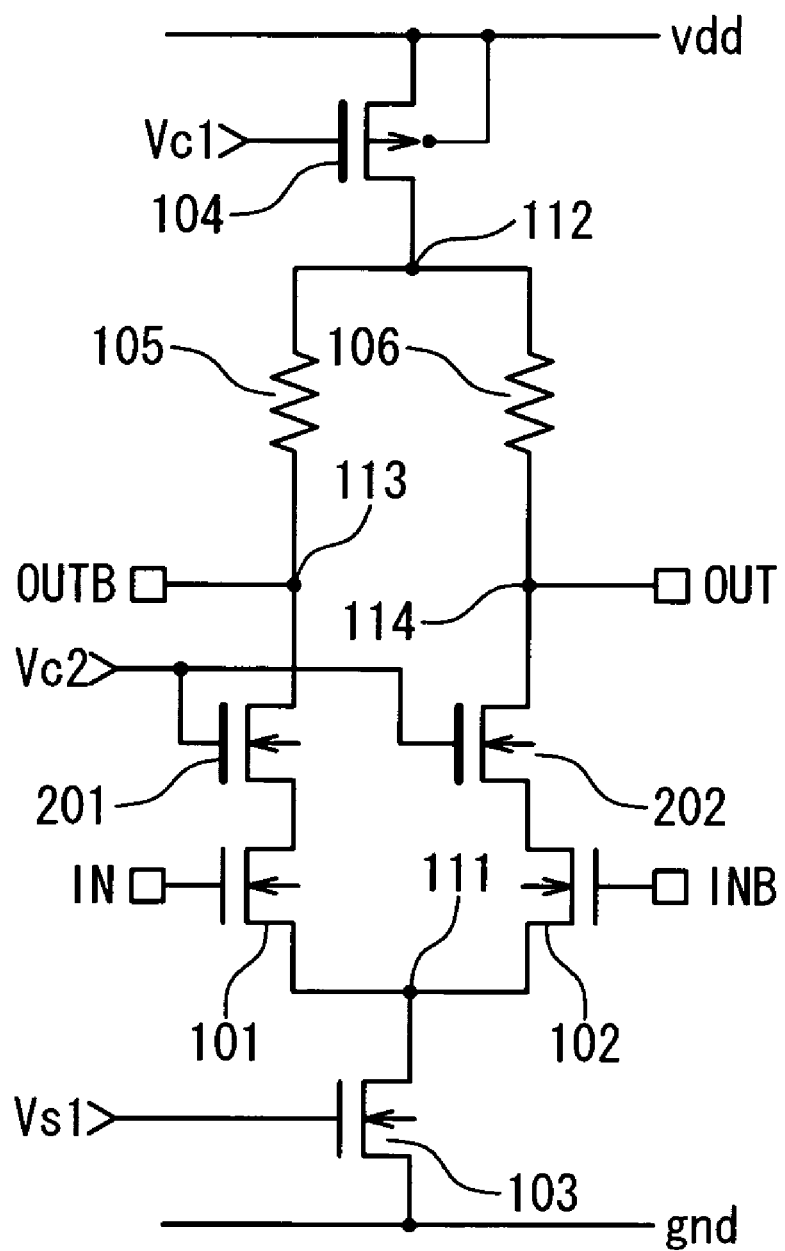
FIG. 2 is a circuit diagram showing a structure of another conventional data output circuit.
Figure 3:
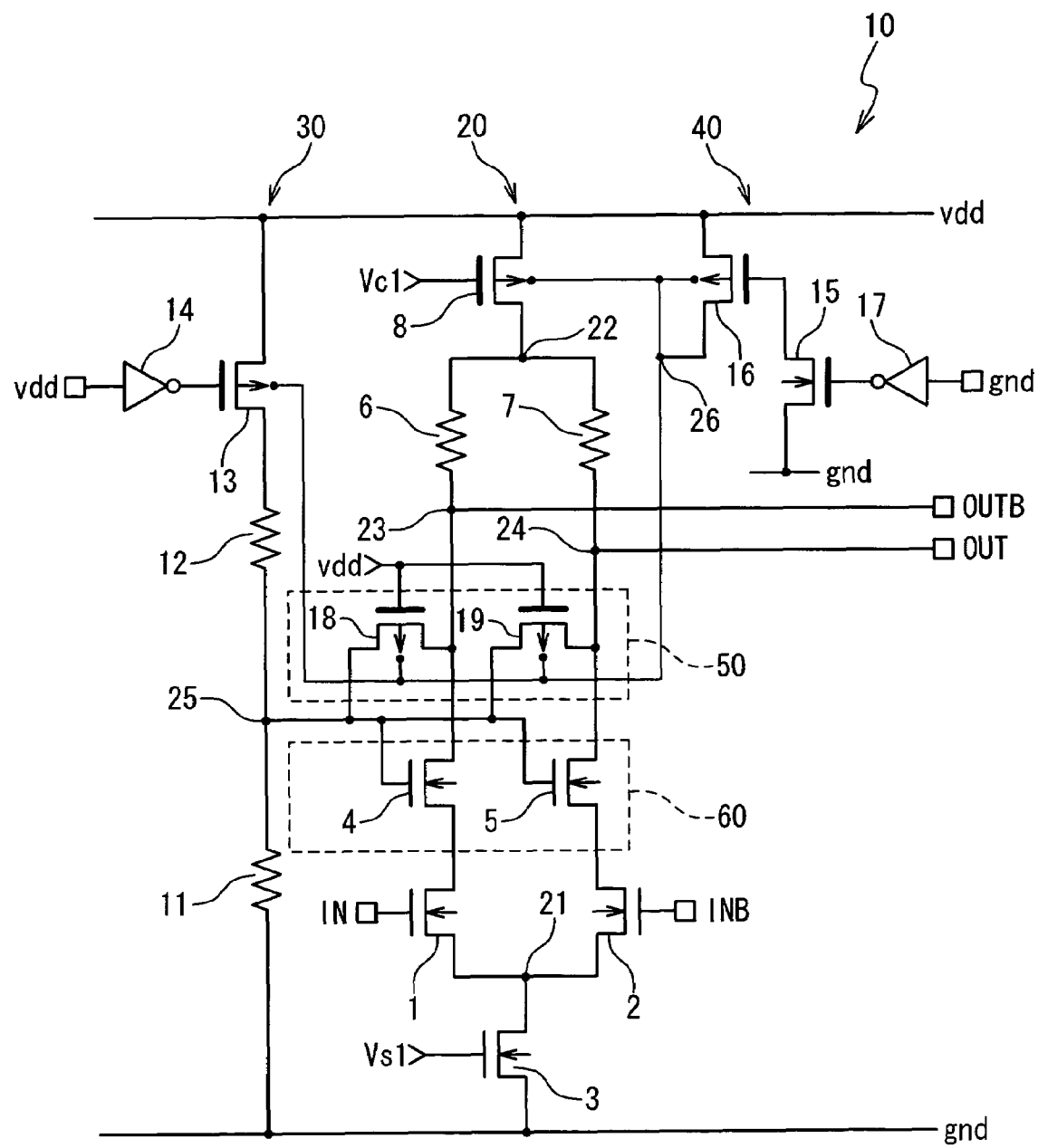
FIG. 3 is a circuit diagram showing an exemplary structure of a data output circuit according to the present invention.

FIG. 3 is a circuit diagram of a data output circuit 10 in this embodiment, which is adapted to operate on a power supply voltage of 3.6V. The data output circuit 10 is designed to develop a pair of output signal voltages on output terminals OUT and OUTB, in response to differential input signal voltages supplied to input terminals IN, INB. In the following explanation, the data output circuit 10 of this embodiment is assumed to be mounted on a CPU board; however, those skilled in the art would appreciate this does not mean to limit applications of the data output circuit 10.

As shown in FIG. 3, the data output circuit 10 is composed of a differential amplifier 20 including an overvoltage protection circuit 60, a voltage divider circuit 30, a substrate potential supply circuit 40, and another overvoltage protection circuit 50. The differential amplifier 20 is composed of a pair of differential NMOS transistors 1 and 2, an NMOS transistor 3 connected to the ground line gnd, a pair of cascade NMOS transistors 4 and 5, resistors 6, and 7, and a PMOS transistor 8. Low-voltage N-channel MOS transistors are used as the NMOS transistors 1 to 5, and a high-voltage P-channel MOS transistor is used as the P-channel MOS transistor 8.

The NMOS transistor 3 is connected to the NMOS transistor 1 and the NMOS transistor 2 through a node 21. A bias Vs1 is applied to the gate of the NMOS transistor 3, and this allows the NMOS transistor 3 to function as a constant-current source. The gate of the NMOS transistor 1 is connected to the input terminal IN receiving a non-inverting input voltage. Correspondingly, the gate of the NMOS transistor 2 is connected to the input terminal INB receiving an inverting input voltage.

The overvoltage protection circuit 60 within the differential amplifier 20 is composed of the cascade NMOS transistor 4, interposed between the NMOS transistor 1 and a node 23, and the cascade NMOS transistor 5, interposed between the NMOS transistor 2 and a node 24. The NMOS transistor 4 is cascade-connected to the NMOS transistor 1. Correspondingly, the NMOS transistor 5 is cascade-connected to the NMOS transistor 2. Gates of the NMOS transistors 4 and 5 are commonly connected to a node 25. The drain of the NMOS transistor 4 is connected to the node 23, and the drain of the NMOS transistor 5 is connected to the node 24.

The resistor 6 is connected between the nodes 22 and 23, while the resistor 7 is connected between the nodes 22 and 24. The PMOS transistor 8 is connected between the node 22 and a power supply line Vdd. A bias Vc1 is applied to the gate of the PMOS transistor 8, and therefore the PMOS transistor 8 functions as a variable resistor. The node 23 is connected to the output terminal OUTB, and the node 24 is connected to the output terminal OUT.

The voltage divider circuit 30 includes a pair of resistors 11 and 12, and a PMOS transistor 13. The PMOS transistor 13 is comprised of a high-voltage transistor. The resistor 11 is connected between the ground line gnd and the node 25, while the resistor 12 is connected between the node 25 and the PMOS transistor 13. The second PMOS transistor 13 is connected between the resistor 12 and the power supply line Vdd. The gate of the PMOS transistor 13 is connected to an inverter 14. The inverter 14 receives the power supply level (that is, the signal level developed on the power supply line Vdd). The voltage divider circuit 30 develops a fixed bias on the node 25, which is supplied to the gates of NMOS transistors 4 and 5.

The substrate potential supply circuit 40 includes an NMOS transistor 15 and a PMOS transistor 16. High-voltage transistors are used as the NMOS transistor 15 and the PMOS transistor 16. The NMOS transistor 15 is connected between the ground line gnd and the gate of the PMOS transistor 16. The gate of the NMOS transistor 15 is connected to an output of an inverter 17. The inverter 17 receives the ground level (that is, the level developed on the ground line gnd). The source of the PMOS transistor 16 is connected to the power supply line Vdd, and the gate of the PMOS transistor 16 is connected to the drain of the NMOS transistor 15. The drain of the PMOS transistor 16 and the substrate region of the PMOS transistor 16 are short-circuited through a node 26; it should be noted that the term "substrate region" means to include a well region. The substrate region of the PMOS transistor 16 is connected to the substrate region with the PMOS transistor 8.

The overvoltage protection circuit 50 includes a pair of PMOS transistors 18 and 19. High-voltage transistors are used for the PMOS transistor 18 and 19. The PMOS transistor 18 is connected between the drain and gate of the NMOS transistor 4, and the PMOS transistor 19 is connected to the drain and gate of the NMOS transistor 5. Gates of the PMOS transistors 18 and 19 are commonly connected to the power supply line Vdd.

Substrate regions of the PMOS transistors 18 and 19 are commonly connected. The commonly connected substrate regions are connected to a substrate region of the PMOS transistor 13. Correspondingly, the substrate regions of the PMOS transistors 18 and 19 are connected to a substrate region of the PMOS transistor 16 through the node 26. Therefore, the substrate regions of the PMOS transistors 8, 13, 16, 18, and 19 within the data output circuit 10 are commonly connected, and the potentials of these substrate regions are maintained at the same level.

The operation of this embodiment will be explained with reference to the drawings.

Figure 4:
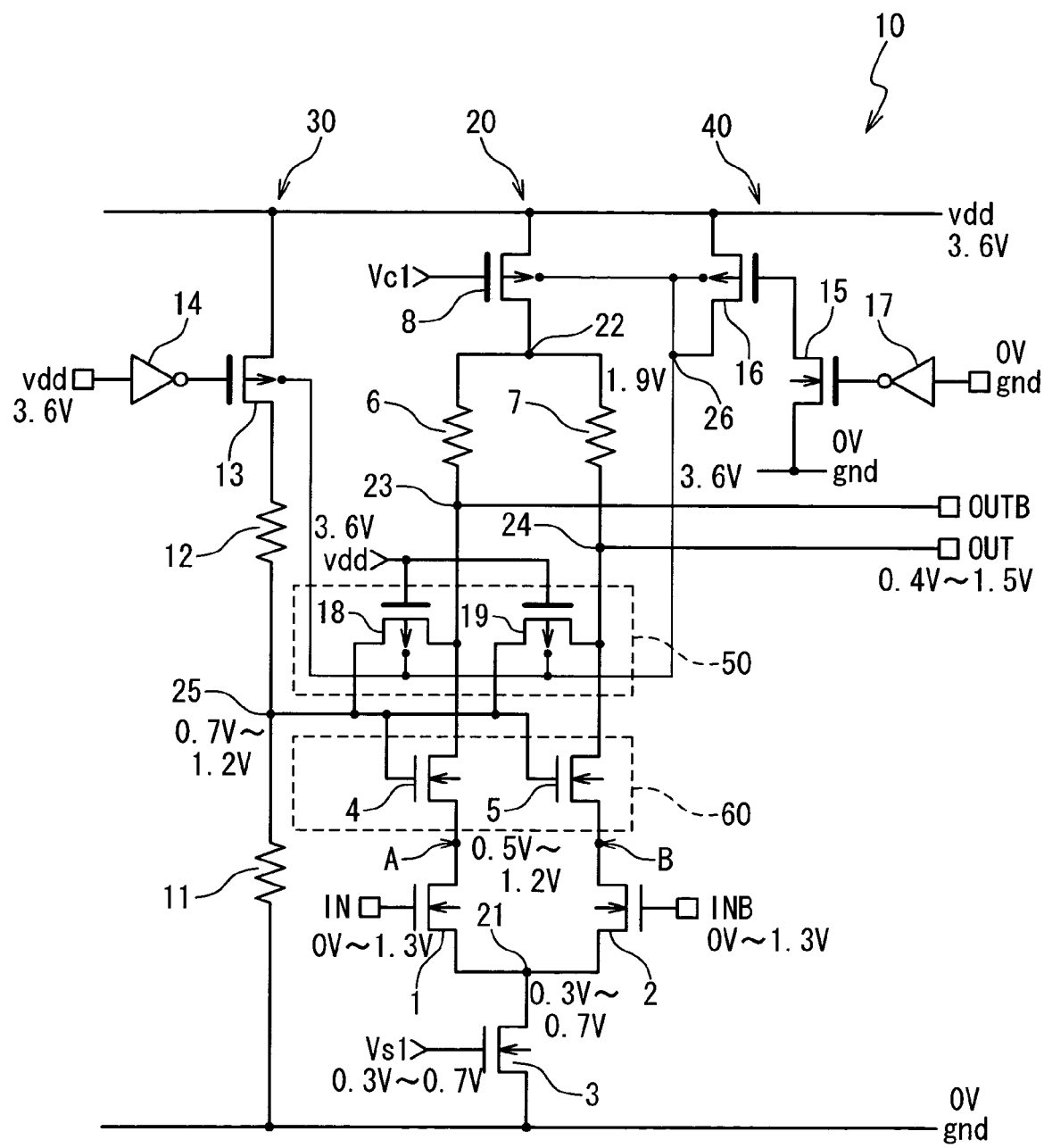
FIG. 4 is a diagram showing an exemplary voltage distribution within the data output circuit of the present invention during normal operations.

FIG. 4 shows an exemplary voltage distribution to the respective nodes within the data output circuit 10 during normal operations, for the case when the power supply line Vdd is provided with a power supply level of 3.6V. The voltage divider circuit 30 develops a voltage level of 0.7 to 1.2V on the node 25 through voltage division with the resistors 11 and 12. This results in that a voltage level of 0.3 to 0.7V is developed on the node 21, and that the maximum output voltage on the output terminals OUT and OUTB) is about 1.5V, which exceeds the rated operation voltage of the low-voltage transistors.

Although the maximum output voltage on the output terminals OUT and OUTB exceeds the rated operation voltage of the low-voltage transistors, this is not critical due to the operation of the overvoltage protection circuit 60. The overvoltage protection circuit 60 maintains the voltage levels on the drains of the NMOS transistors 1 and 2 (that is, the sources of the NMOS transistors 4 and 5, denoted by the symbols "A" and "B" in FIG. 4) in the range of 0.5 to 1.2V. This allows the applied voltages across all of the low-voltage transistors within the data output circuit 10, including the gate-drain voltages, the gate-source voltages, and the gate-substrate voltages, and the drain-source voltages, to be reduced below the rated operation voltage of the low-voltage transistors.

Figure 5:
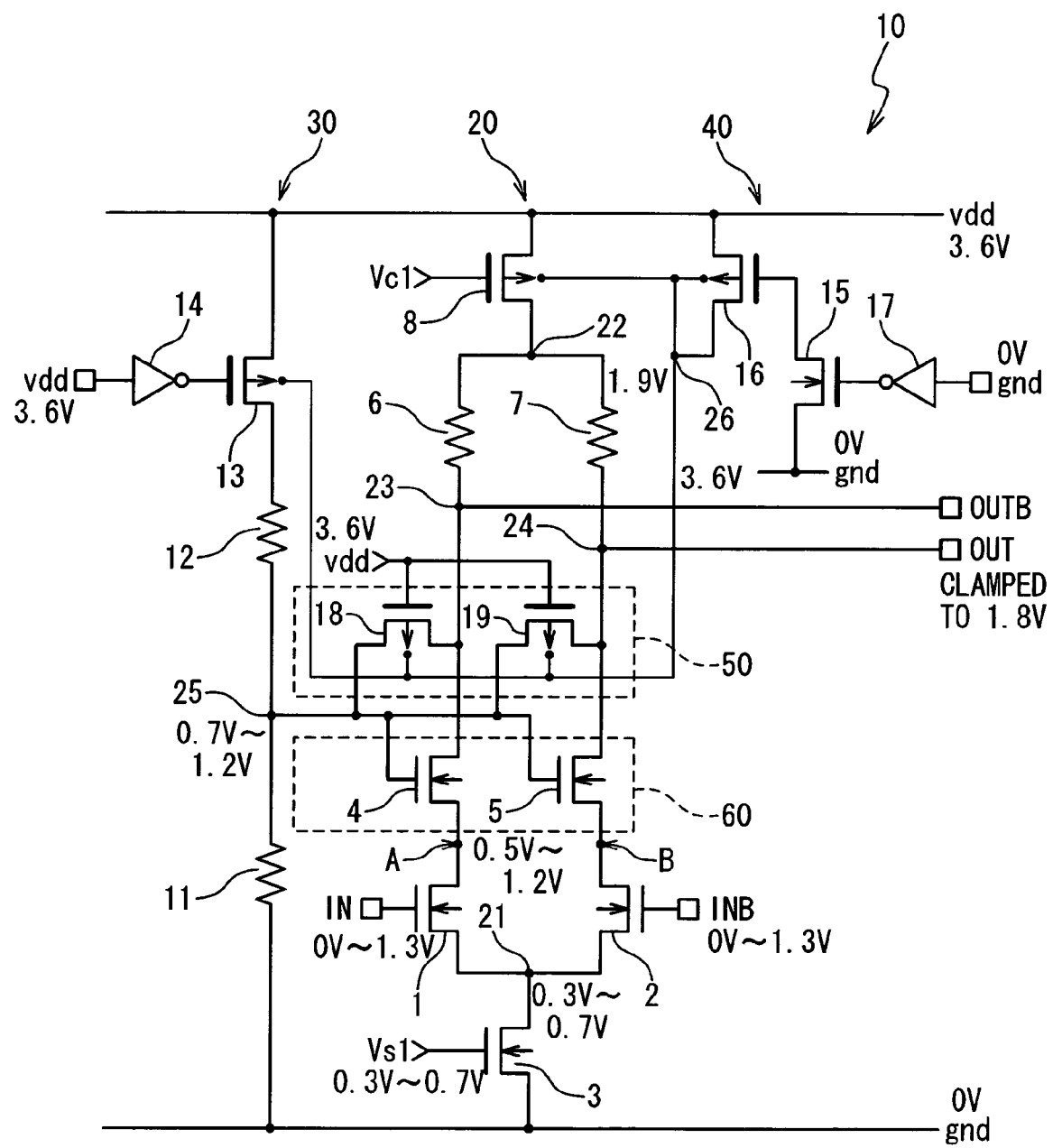
FIG. 5 is a diagram showing an exemplary voltage distribution within the data output circuit of the present invention when overvoltage is applied thereto.

FIG. 5 shows an exemplary voltage distribution to the nodes within the data output circuit 10 when an undesirable surge voltage of 1.8V is externally applied on the output terminal OUT for some reason during operations with the power supply line Vdd provided with a power supply level of 3.6 V. As is the case of FIG. 4, the voltage divider circuit 30 develops a voltage level of 0.7 to 1.2V on the node 25 through voltage division with the resistors 11 and 12, and a voltage level of 0.3 to 0.7V is developed on the node 21.

Even if an undesirable surge voltage of 1.8V is externally supplied to the output terminal OUT, the overvoltage protection circuit 60 maintains the voltage levels on the drains of the NMOS transistors 1 and 2 (that is, the sources of the NMOS transistors 4 and 5, denoted by the symbols "A" and "B" in FIG. 5) in the range of 0.5 to 1.2V. This allows the applied voltages across all of the low-voltage transistors within the data output circuit 10 to be reduced below the rated operation voltage of the low-voltage transistors.

Figure 6:
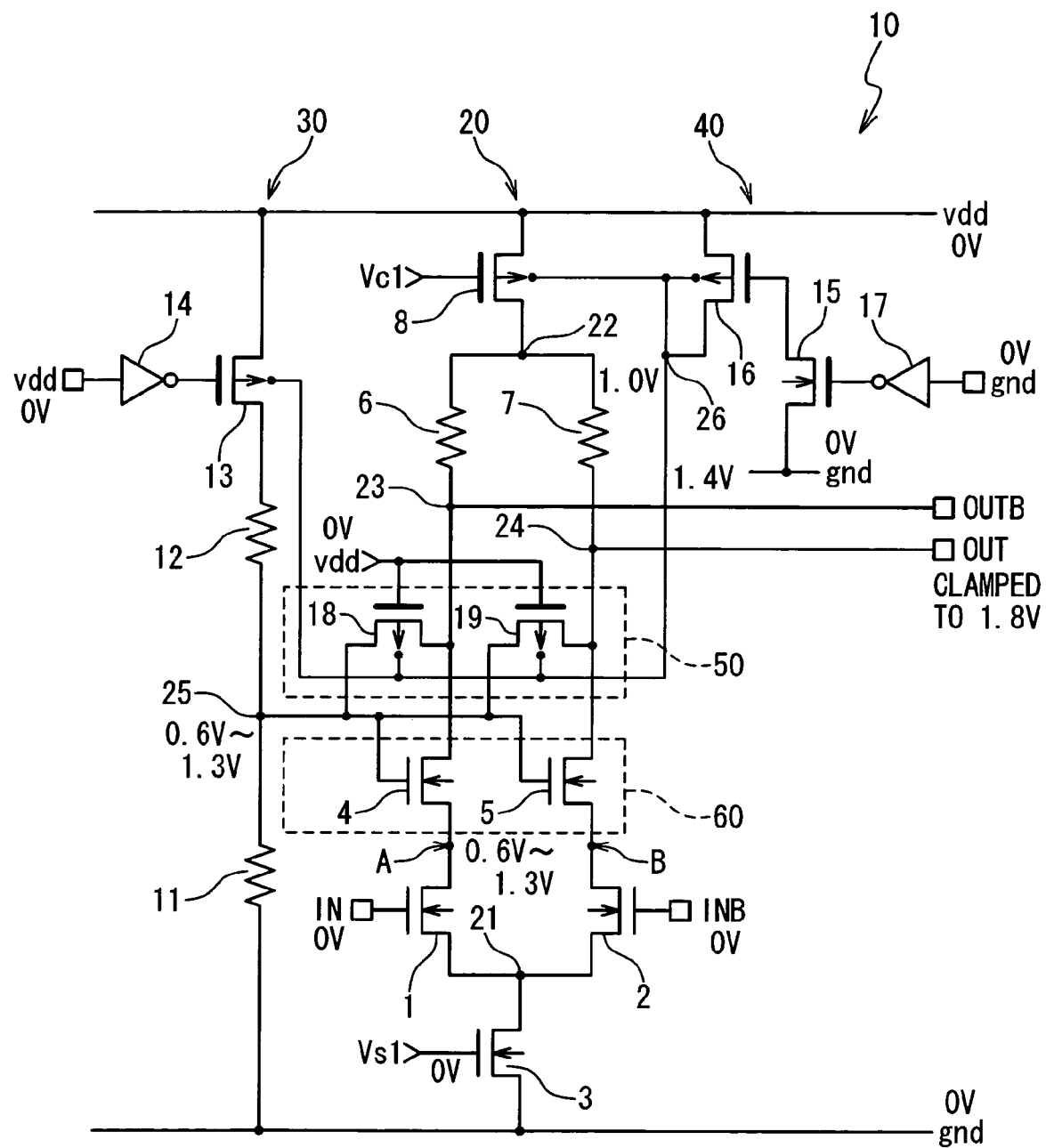
FIG. 6 is a diagram showing an exemplary voltage distribution within the data output circuit of the present invention when power supply is cut off.

FIG. 6 shows an exemplary voltage distribution to the respective nodes within the data output circuit 10, when the power supply is cut off, that is, when the voltage level on the power supply line Vdd is close to 0V. This is the case for a CPU board, for instance, when the CPU board is additionally connected to a slot of a backplane board; the power supply voltage of the data output circuit 10 within the CPU board is 0V, before an electrical connection is established between the CPU board and the backplane board. Connecting the CPU board with the backplane board may cause an undesirable overvoltage or surge to be applied on the output terminals OUT, OUTB.

As shown in FIG. 6, since the voltage levels on the power supply line Vdd is close to 0V with the power supply cut off, the PMOS transistors 18 and 19 within the overvoltage protection circuit 50 are placed into the "ON" states. This provides current paths from the output terminals OUT and OUTB to the ground lines gnd through the resistor 11. When a current flows through any of the current paths, a bias is developed on the gates of the NMOS transistors 4 and 5. The voltage level of the developed bias depends on the ratio of the ON resistance of the PMOS transistors 18 and 19 to the resistance of the resistor 11. In an actual embodiment, the ratio of the ON resistance of the PMOS transistors 18 and 19 to the resistance of the resistor 11 is adjusted so that the voltage levels on the gates of the NMOS transistors 4 and 5 are maintained at the same voltage level during normal operations.

As shown in FIG. 6, the voltage levels on the gates of the NMOS transistors 4 and 5 are maintained in the range of 0.6 to 1.3V due to the functions of the overvoltage protection circuit 50 and the third resistor 11, when an undesirable surge voltage of 1.8V is applied to the output terminal OUT (or output terminal OUTB) with the voltage level of the power supply line Vdd is 0V. Specifically, the PMOS transistor 18 (or the PMOS transistor 19) maintains the voltage levels on the drains of the NMOS transistors 1 and 2 (that is, the sources of the NMOS transistors 4 and 5, denoted by symbols "A" and "B" in FIG. 6) in the range of 0.6 to 1.3V. As thus-described, the overvoltage protection circuit 50 reduces the voltages across the low-voltage NMOS transistors 4 and 5, including the gate-drain voltages, the gate-source voltages, the gate-substrate voltages, and the drain-source voltages, below the rated operation voltages, even when an undesirable surge voltage exceeding the rated operation voltage of the low voltage transistors is externally applied with the voltage of the power supply line Vdd being 0V.

Additionally, the overvoltage protection circuit 60 reduces the voltages across the low-voltage NMOS transistors 1 and 2 below the rated operation voltages, since the gates of the low-voltage NMOS transistors 4, 5 are maintained at the substantially same voltage level as that developed during normal operations.

In summary, the above-described architecture effectively provides overvoltage and surge protection for the low-voltage transistors within the data output circuit 10.

Additional advantage of the data output circuit 10 is that the above-described architecture allows the data output circuit 10 to be composed of size-reduced transistors. The PMOS transistors 18 and 19 are allowed to have an increased on-resistance, or a reduced gate width, because the on-resistance of the PMOS transistors 18 and 19 does not affect the operation speed of the data output circuit; the increased on-resistance of the PMOS transistors 18 and 19 does not reduce the operation speed of the data output circuit 10.

Figure 7:
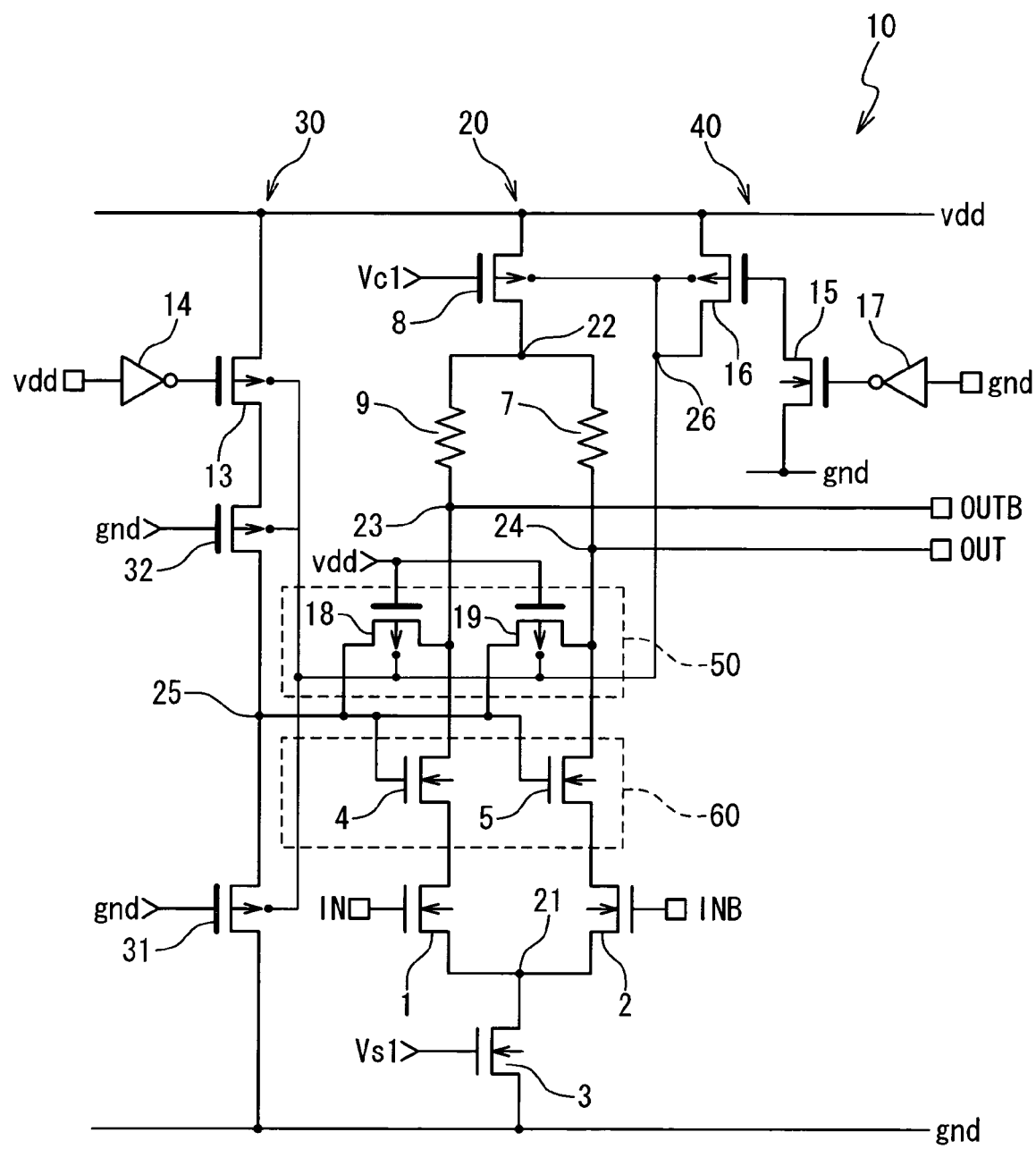
FIG. 7 is a circuit diagram showing another exemplary structure of the data output circuit of the present invention.

FIG. 7 is a circuit diagram of another exemplary structure of the data output circuit 10. The data output circuit 10 shown in FIG. 7 includes has a pair of PMOS transistors 31 and 32, instead of the resistors 11 and 12. The PMOS transistors 31 and 32 function as resistor elements, having the gates clamped to a predetermined voltage level. In this embodiment, the gates of the PMOS transistors 31 and 32 are clamped to the ground level. The substrate regions of the PMOS transistors 31 and 32 are commonly connected to those of the PMOS transistors 8, 13, 16, 18, and 19.

This architecture is superior in reducing undesirable effects of fabrication variation. The actual resistance of the resistor 11 may be different from the designed value due to fabrication variation. Because resistors are fabricated in a different process from that of MOS transistors, fabrication variation may differentiate the actual ratio of the resistance of the resistor 11 to the on-resistance of the PMOS transistors 18 (or the PMOS transistor 19) from the designed value.

The use of the PMOS transistors 31 and 32 in place of the resistors 11 and 12 effectively reduces the undesirable effect of fabrication variation. Because the PMOS transistors 31 and 32 within the voltage divider circuit 30 are fabricated in the same process of the PMOS transistors 18 and 19 within the overvoltage protection circuit 50, the fabrication variations causes the same effect on all of these PMOS transistors. Therefore, the ratio of on-resistances of the PMOS transistors 31 and 32 to those of the PMOS transistors 18 are 19 is maintained close to the desired value, even if the data output circuit 11 suffers from fabrication variation.

It is apparent that the present invention is not limited to the above-described embodiments, which may be modified and changed without departing from the scope of the invention.

What is claimed is:

1. A data output circuit comprising:

first and second differential MOS transistors receiving first and second input voltages, respectively, sources of said differential MOS transistors being commonly connected;

first and second outputs;

a first cascade MOS transistor connected between said first differential MOS transistor and said first output;

a second cascade MOS transistor connected between said second differential MOS transistor and said second output, gates of said first and second cascade MOS transistors being commonly connected;

a first resistive element connected between a ground line and said commonly connected gates;

a second resistive element connected between a power supply line and said commonly connected gates;

a first MOS transistor connected between said first output and a gate of said first cascade MOS transistor, having a gate connected to said power supply line; and a second MOS transistor connected between said second output and a drain and a gate of said second cascade MOS transistor, having a gate connected to said power supply line.

2. The data output circuit according to claim 1, wherein said first resistive element comprises a P-channel MOS transistor having a gate clamped to a predetermined voltage level.

3. The data output circuit according to claim 1, wherein said second resistive element comprises a P-channel MOS transistor having a gate clamped to a predetermined voltage level.

4. The data output circuit according to claim 1, wherein said first MOS transistor comprises a first P-channel MOS transistor, and said second MOS transistor comprises a second P-channel MOS transistor.

5. The data output circuit according to claim 4, further comprising:

a third P-channel MOS transistor having a source connected to said power supply line, and a substrate region short-circuited to a drain thereof, wherein substrate regions of said first and second P-channel MOS transistors are connected to said substrate region of said third P-channel MOS transistor.

6. The data output circuit according to claim 5, wherein said first resistive element comprises a fourth P-channel MOS transistor having a gate clamped to a predetermined voltage level and a substrate region connected to said substrate region of said third P-channel MOS transistor.

7. The data output circuit according to claim 5, wherein said second resistive element comprises a fifth P-channel MOS transistor having a gate clamped to a predetermined voltage level and a substrate region connected to said substrate region of said third P-channel MOS transistor.

8. The data output circuit according to claim 5, further comprising a third resistive element connected between said power supply line and said first and second output lines.

9. The data output circuit according to claim 8, wherein said third resistive element comprises a sixth P-channel MOS transistor having a source connected to said power supply line, a drain connected to said first and second output lines, and a substrate region connected to said substrate region of said third P-channel MOS transistor.

* * * * *